(12) United States Patent
Lee

(10) Patent No.: US 6,828,848 B2
(45) Date of Patent: Dec. 7, 2004

(54) INTEGRATED CIRCUIT DEVICE CAPABLE OF OPTIMIZING OPERATING PERFORMANCE ACCORDING TO CONSUMED POWER

(75) Inventor: Byeong-Hoon Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/424,313

(22) Filed: Apr. 28, 2003

(65) Prior Publication Data

US 2004/0036526 A1 Feb. 26, 2004

(30) Foreign Application Priority Data

Aug. 20, 2002 (KR) .................................. 10-2002-0049132

(51) Int. Cl.[7] .................................................. H03K 3/01
(52) U.S. Cl. ........................................ 327/534; 327/291
(58) Field of Search ............................... 327/155, 162, 327/291, 299, 544, 530, 534, 535, 538, 543; 331/57

(56) References Cited

U.S. PATENT DOCUMENTS 6,243,784 B1 * 6/2001 Anderson et al. ........... 713/401
6,445,253 B1 * 9/2002 Talbot ........................ 331/57

FOREIGN PATENT DOCUMENTS

| JP | 11-306781 | 5/1999 |
| KR | 2001-61456 | 7/2001 |

* cited by examiner

Primary Examiner—Jeffrey Zweizig
(74) Attorney, Agent, or Firm—F. Chau & Associates, LLC

(57) ABSTRACT

Circuits and methods for optimizing operating performance of an integrated circuit device within a maximum allowed current by varying a period of a clock signal based on an amount of current consumed by the integrated circuit device. In one aspect, an integrated circuit device includes a plurality of functional blocks, a power supply line which supplies an internal power supply voltage to the functional blocks, a voltage converter circuit which controls an amount of current supplied to the power supply line by comparing a reference voltage with the internal power supply voltage, and a clock generator circuit which generates a clock signal that is applied to the functional blocks. The clock generator circuit adjusts a period of the clock signal according to the amount of current supplied to the power supply line.

24 Claims, 3 Drawing Sheets

INTEGRATED CIRCUIT DEVICE CAPABLE OF OPTIMIZING OPERATING PERFORMANCE ACCORDING TO CONSUMED POWER

CROSS-REFERENCE TO RELATED APPLICATION

This application claims priority to Korean Patent Application No. 2002-49132, filed on Aug. 20, 2002, which is incorporated herein by reference.

TECHNICAL FIELD OF THE INVENTION

The present invention is related to integrated circuit devices, and in particular to a device and method for varying the period or frequency of a clock signal according to current consumption.

BACKGROUND

The use of various integrated circuit devices with portable equipment has become widespread. These integrated circuit devices are referred to as "embedded system chips" or "embedded chips". An embedded chip is supplied with voltage from a power supply of the portable equipment, which is typically some form of battery. To conserve battery power, low-power operation is typically a requirement for such equipment. The amount of power consumption is primarily based on the given application(s). For example, clock speed is one significant factor that is used to determine the power consumption in an embedded system chip. Since embedded chips operate in synchronization with a clock, power consumption increases in proportion to an increase of the clock speed and power consumption decreases in proportion to a decrease of the clock speed. Therefore, for a low-power system, it is a general design criteria to limit the electric power consumption via limitation of the clock speed.

Typically, a plurality of different functional blocks (components, devices, circuits, etc.) are included in an embedded system chip. In general, an operable clock speed and power consumption are pre-specified for all functional blocks or embedded system chips. More specifically, to obtain the maximum performance of a chip within the maximum power range determined in a specification, the design of an optimized clock speed is significantly considered when designing an embedded system chip or a system. In case of an embedded system chip or a functional block where the power consumption affects its operating performance, a simple and generalized design method is as follows: (i) determine the power when operating a functional block having the largest power consumption; (ii) determine a clock as an internal clock, when the determined power is a maximum allowed power; and (iii) design other functional blocks (or embedded system chips) on the basis of the determined clock.

This conventional design method described above, however, has a disadvantage in that the operating performance is sub-optimal due to the fixed clock speed which is applied even with a functional block (or system) whose current consumption is relatively less.

SUMMARY OF THE INVENTION

The present invention is directed to circuits and methods for optimizing operating performance of an integrated circuit device within a maximum allowed current by varying a period of a clock signal based on an amount of current consumed by the integrated circuit device.

In accordance with one aspect of the invention, an integrated circuit device comprises a plurality of functional blocks each operating in synchronization with a clock signal, a power supply line that supplies an internal power supply voltage to the functional blocks, a charge storing means connected to the power supply line, a comparator circuit that compares a voltage on the power supply line with a reference voltage and generates a control voltage based on the result of the comparison, a charge supplying means that supplies charges from an external power supply voltage to the power supply line in response to the control voltage, and a clock generator circuit that generates a clock signal in response to the control voltage, wherein the period of the clock signal varies according to variation of the control voltage.

Preferably, when the control voltage increases, the period of the clock signal increases, and when the control voltage decreases, the period of the clock signal decreases.

In another aspect of the invention, the charge supplying means comprises a PMOS transistor that is connected between the external power supply voltage and the power supply line, and which is controlled by the control voltage. The charge storing means preferably comprises a capacitor connected between the power supply line and ground.

In yet another aspect of the invention, the clock generator circuit comprises a first means for generating second control voltage that varies according to variation of the control voltage, and a second means for generating the clock signal whose period varies according to variation of the second control voltage. Preferably, the first means comprises a PMOS transistor, which is connected between the external power supply voltage and an output node, for outputting the second control voltage, and an NMOS transistor, which is connected between the output node and ground, and which operates responsive to the second control voltage.

In another aspect of the invention, the second means for generating a clock signal comprises a plurality of inverters which are connected in series to the clock signal, a plurality of capacitors which are connected between output terminals of the inverters and ground, and a plurality of NMOS transistors which are connected between the output terminals of the inverters and the capacitors, wherein the NMOS transistors are controlled in common by the second control voltage.

In yet another aspect of the invention, the second means for generating a clock signal comprises a clock generator that generates a plurality of clock signals in response to a reference clock signal, each of the clock signals having different periods from each other, a signal generator that generates select signals in response to the second control voltage, and a selector that selects one of the clock signals in response to the select signals, wherein the selected clock signal is applied to the functional blocks as a clock signal.

In another aspect of the invention, a method for optimizing the operating performance of an integrated circuit device, which includes a plurality of functional blocks, comprises the steps of detecting an amount of current consumed by the integrated circuit device, controlling an amount of current supplied to the functional blocks based on the detected current consumption, and adjusting a period of a clock signal applied to the functional blocks based on the detected current consumption.

BRIEF DESCRIPTION OF THE DRAWINGS

A more complete appreciation of the present invention, and many of the attendant advantages thereof, will become readily apparent as the same becomes better understood by reference to the following detailed description when considered in conjuction with the accompanying drawings in which like reference symbols indicate the same or similar components, wherein.

DESCRIPTION OF PREFERRED EMBODIMENTS

Figure 1:
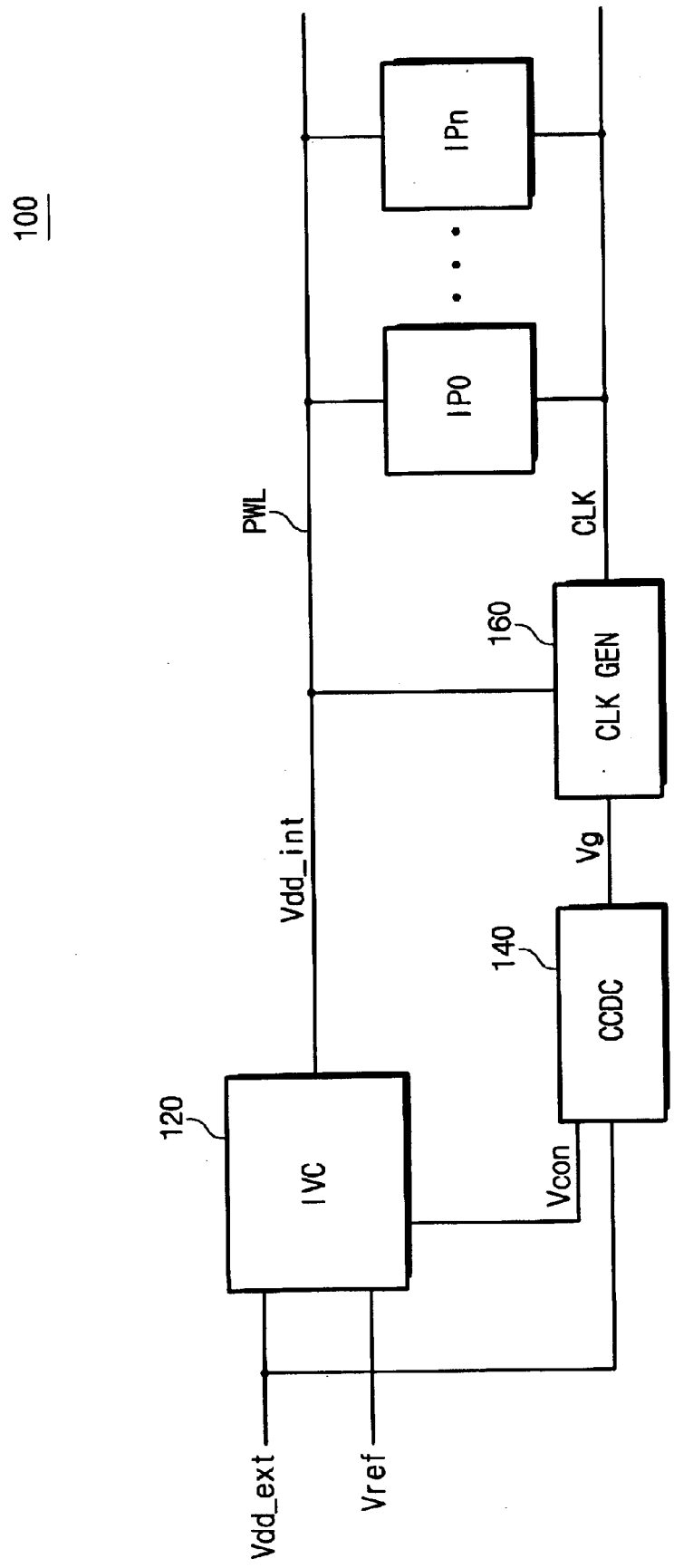
FIG. 1 is a schematic diagram of an integrated circuit device according to an embodiment of the present invention.

FIG. 1 is a schematic diagram of an integrated circuit device according to an embodiment of the invention. An integrated circuit device 100 includes an internal voltage converter circuit (IVC) 120, a consumed current detector circuit (CCDC) 140, a clock generator circuit (CLK GEN) 160, and a plurality of functional blocks IP0–IPn, which can be components, devices, circuits, etc. The functional blocks IP0–IPn are connected in common to a power supply line PWL.

The internal voltage converter circuit 120 is supplied with an external power supply voltage Vdd_ext and a reference voltage Vref, and converts the external power supply voltage Vdd_ext to an internal power supply voltage Vdd_int. More specifically, the internal voltage converter circuit 120 supplies charges/current from the external power supply voltage Vdd_ext to the power supply line PWL, based on a result of a comparison between the external power supply voltage Vdd_ext and the reference voltage Vref. The consumed current detector circuit 140 is supplied with the external power supply voltage Vdd_ext, and detects variation of current supplied from the external power supply voltage Vdd_ext to the power supply line PWL in response to a control voltage Vcon. The control voltage Vcon is generated according to the comparison result of the internal voltage converter circuit 120. The consumed current detector circuit 140 generates a gate voltage Vg that varies based on variation of the detected current. A clock generator circuit 160 is supplied with the internal power supply voltage Vdd_int, and generates a clock signal CLK whose period varies according to the gate voltage Vg from the consumed current detector circuit 140. The clock signal CLK is supplied to the functional blocks IP0–IPn.

In the integrated circuit device 100, the period (or speed) of the clock signal CLK varies according to the amount of internally consumed current of the device 100. For example, when current consumption increases, the period of the clock signal CLK increases (i.e., the clock speed decreases). When current consumption decreases, the period of the clock signal CLK decreases (i.e., the clock speed increases). More specifically, assuming that the maximum allowed current of the integrated circuit device 100 is pre-determined, as the consumed current approximates the maximum allowed current, the period of the clock signal CLK becomes increasingly longer. This means that the functional blocks IP0–IPn operate with an optimized clock speed without a decrease in the operating performance due to the limitation of the clock speed of any functional block.

Figure 2:
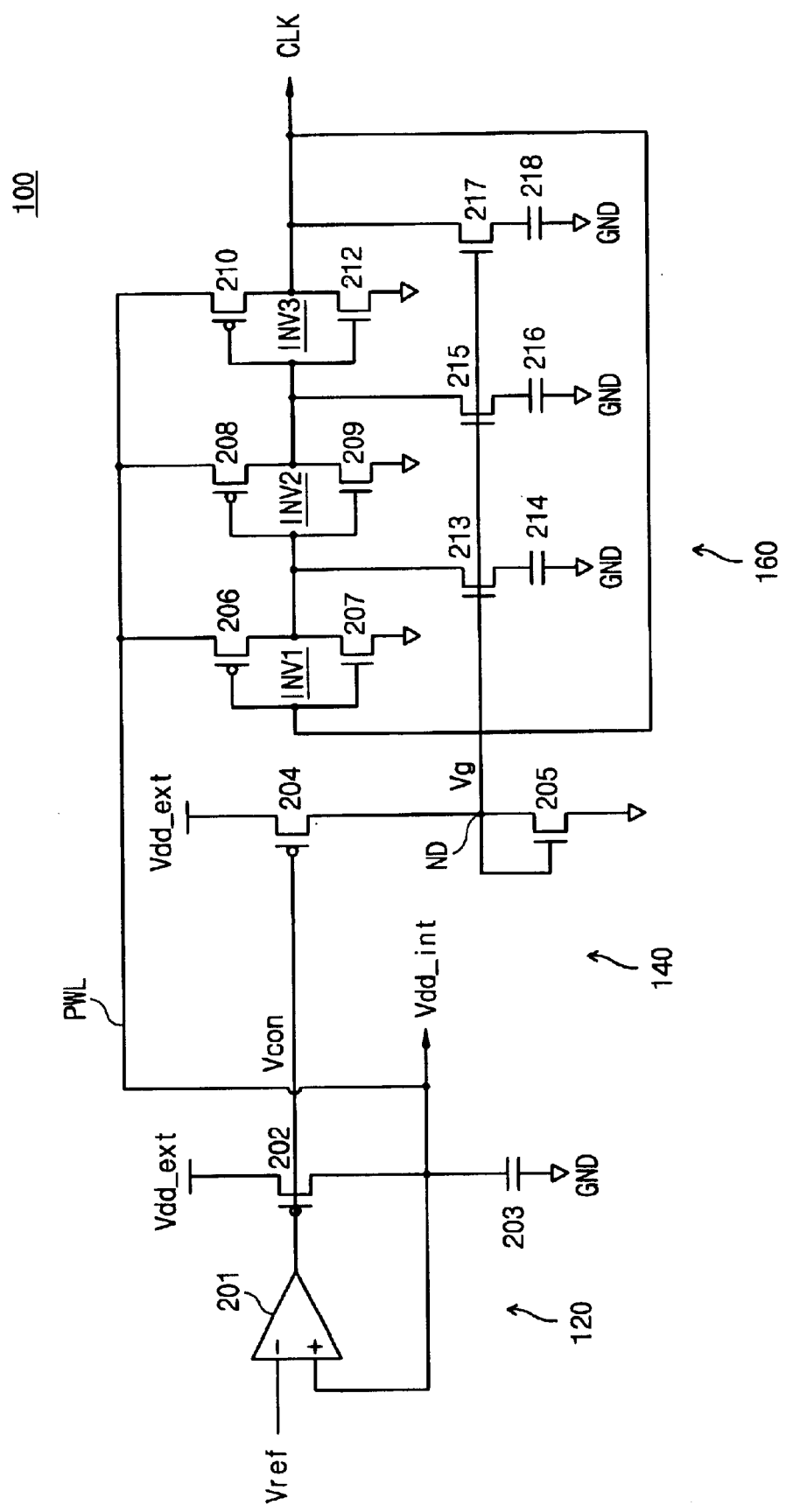
FIG. 2 is a circuit diagram of an integrated circuit device according to an embodiment of the present invention.

FIG. 2 shows a circuit diagram of an integrated circuit device according to an embodiment of the present invention. Referring to FIG. 2, an internal voltage converter circuit 120 includes a comparator 201, a PMOS transistor 202, and a capacitor 203. The PMOS transistor 202 is connected between an external power supply voltage Vdd_ext and a power supply line PWL, and is controlled by an output voltage Vcon of the comparator 201. The capacitor 203 is connected between the power supply line PWL and ground voltage GND. The comparator 201 includes a non-inverting terminal (+) that is connected to the line PWL, an inverting terminal (−) that is connected to a reference voltage Vref, and an output terminal that outputs control voltage Vcon. The PMOS transistor 202 supplies current/charges from the external power supply voltage Vdd_ext to the power supply line PWL in response to the control voltage Vcon. The capacitor 203 stores the charges that are supplied to the power supply line PWL.

The circuit of FIG. 2 further comprises a consumed current detecting circuit 140 including a PMOS transistor 204 and an NMOS transistor 205. The PMOS transistor 204 includes a gate that receives the control voltage Vcon, a source that is connected to the external power supply voltage Vdd_ext and a drain that is connected to output node ND for outputting a gate voltage Vg. The NMOS transistor 205 includes a gate that is connected to the output node ND, a drain that is connected to the output node ND and a source that is connected to the ground voltage GND.

As further illustrated in FIG. 2, a clock generator circuit 160 comprises a ring oscillator circuit including serially-connected inverters. In particular, the clock generator circuit 160 includes three inverters INV1, INV2, and INV3, three NMOS transistors 213, 215, and 217, and three capacitors 214, 216, and 218. Each of the inverters INV1, INV2, and INV3 comprises a PMOS transistor and an NMOS transistor. The inverters INV1, INV2, and INV3 are connected in series to an output terminal CLK. An input terminal of the first inverter INV1 is connected to an output terminal of the last inverter INV3. An NMOS transistor and a capacitor are connected in series between an output terminal of each inverter and a ground voltage. For example, the NMOS transistor 213 and the capacitor 214 are connected in series between an output terminal of the inverter INV1 and the ground voltage GND. The NMOS transistor 215 and the capacitor 216 are connected in series between an output terminal of the inverter INV2 and the ground voltage GND. The NMOS transistor 217 and the capacitor 218 are connected in series between an output terminal of the inverter INV3 and the ground voltage GND. The NMOS transistors 213, 215, and 217 are controlled in common by the gate voltage Vg from the consumed current detector circuit 140. The consumed current detector circuit 140 acts as a control circuit for controlling the NMOS transistors 213, 215, and 217 of the clock generator circuit 160.

A mode of operation of the integrated circuit device shown in FIG. 2 will now be described in further detail with reference to FIGS. 1 and 2.

As the functional blocks IP0–IPn operate, the internal power supply voltage Vdd_int becomes lower than a target voltage due to current consumption by one or more of the functional blocks. The voltage drop of the internal power supply voltage Vdd_int can be restored to the target voltage by supplying current from an external power supply voltage Vdd_ext to a power supply line PWL via a PMOS transistor 202. This operation is accomplished via the comparator 201. For example, when the Vdd_int is lower than the Vref, a control voltage Vcon from the comparator 201 is reduced, which causes the current flowing via the transistor 202 to increase. When the Vdd_int is higher than the Vref, the control voltage Vcon increases, which causes the current flowing via the transistor 202 to decrease. The internal power supply voltage Vdd_int is continuously restored to the target voltage by repetition of these operations.

Thus, as described above, if the amount of current consumed in the device 100 increases, the amount of current flowing via the PMOS transistor 202 also increases. If the amount of current consumed in the device 100 decreases, the amount of current flowing via the PMOS transistor 202 also decreases. The amount of current flowing through the transistor 202 is determined by the control voltage Vcon output from the comparator 201.

The current needed for restoring a lowered voltage Vdd__int is supplied through the PMOS transistor 202 according to the control voltage Vcon. The amount of current supplied via the transistor 202 is detected/sensed via a PMOS transistor 204 and an NMOS transistor 205. Since the PMOS transistor 204 operates in response to the same control voltage Vcon as the PMOS transistor 202, the amount of current flowing through the transistor 204 varies in proportion to the amount of current flowing through the transistor 202 and thus, provides an indication as to whether the current consumption of the device 100 increases or decreases.

The current flowing through the PMOS transistor 204 is mirrored in the NMOS transistor 205. In this mirror structure, gate voltage Vg varies according to the amount of current flowing through the PMOS transistor 204. As such, the gate voltage Vg is adjusted according to the current consumption of the device 100. As the gate voltage Vg is adjusted, the period of a clock signal CLK is adjusted. More specifically, if there in an increase in the gate voltage Vg that is applied in common to gates of transistors 213, 215, and 217, the amount of current that is supplied to the capacitors 214, 216, and 218 will increase. On the other hand, if the gate voltage Vg decreases, the amount of current supplied to the capacitors 214, 216, and 218 will decreases. In case of the former, the effective capacitance of the capacitors 214, 216, and 218 will increase, which causes a decrease in the clock speed (or an increase in the clock period). In case of the latter, effective capacitance of the capacitors 214, 216, and 218 will decrease, which causes the clock speed to increase (or a decrease in the clock period).

In summary, in the embodiment of FIG. 2, if an internal power supply voltage Vdd_int decreases due to an increase in the current consumption of the integrated circuit device, the control voltage Vcon will decrease and the amount of current flowing to the power supply line PWL through the PMOS transistor 202 will increase. Then, since the amount of current flowing via the transistor 202 increases and the amount of current flowing through an NMOS transistor 205 increases, the gate voltage Vg increases. An increase in the gate voltage Vg results in an increase in the effective capacitance of capacitors 214, 216, and 218 and, consequently, the clock speed will decrease. On the other hand, if the internal power supply voltage Vdd_int increases due to a decrease in the current consumption of the integrated circuit device, the control voltage Vcon will increase and the amount of current flowing to the power supply line PWL through the PMOS transistor 202 will decrease. Then, since the amount of current flowing via the transistor 202 decreases and the amount of current flowing through the NMOS transistor 205 decreases, the gate voltage Vg will decrease. A decrease in the gate voltage Vg results in a decrease in the effective capacitance of capacitors 214, 216, and 218 and, consequently, the clock speed will increase.

Figure 3:
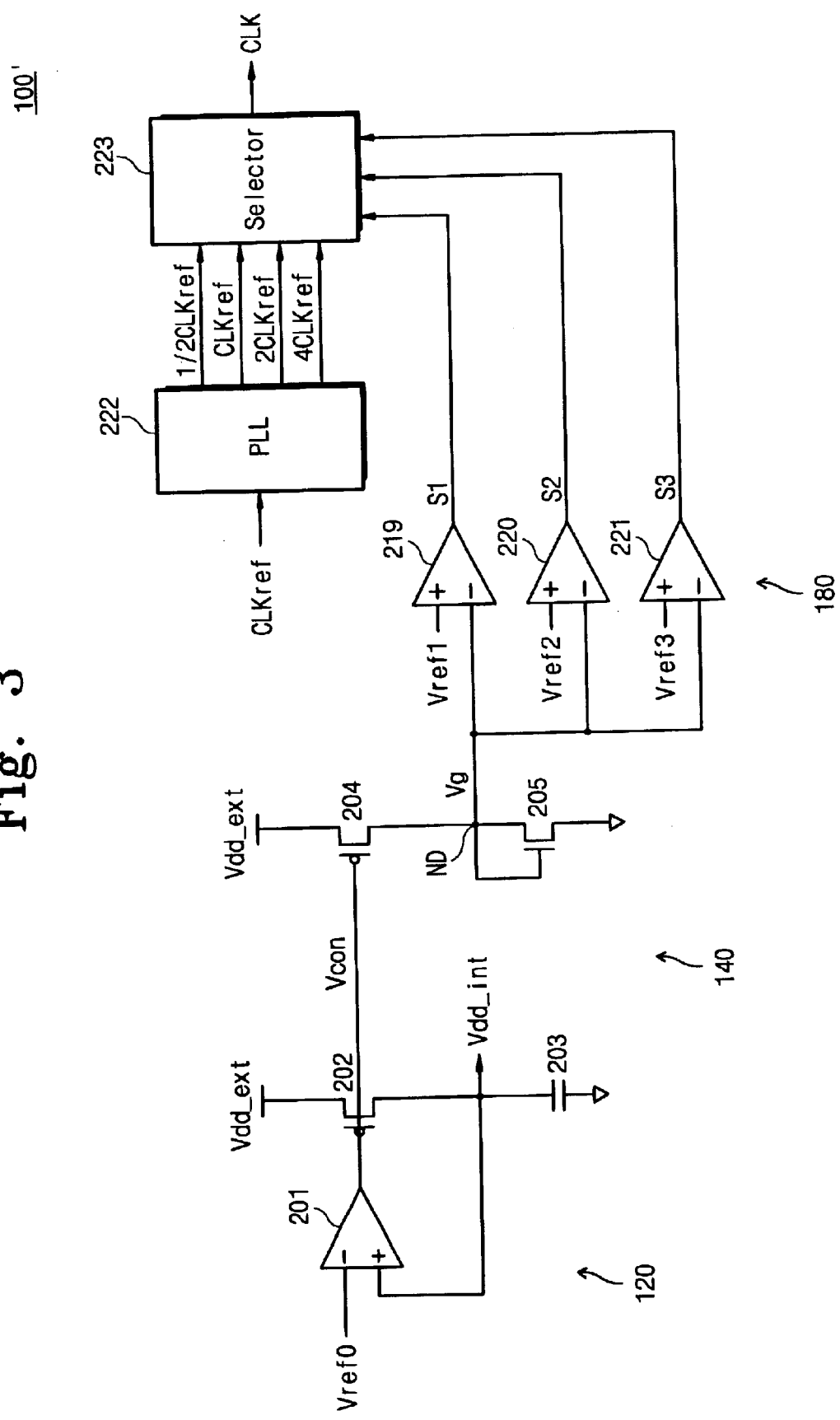
FIG. 3 is a circuit diagram of an integrated circuit device according to another embodiment of the present invention.

FIG. 3 shows a circuit diagram of an integrated circuit device according to another embodiment of the present invention. In FIG. 3, the elements that are the same as those elements depicted in FIG. 2 are denoted by the same reference numerals and the descriptions thereof will not be repeated. A reference voltage Vref0 depicted in FIG. 3 is the same as Vref of FIG. 2.

Referring to FIG. 3, a signal generator circuit 180 generates select signals S1, S2, and S3 in response to a gate voltage Vg from a consumed current detector circuit 140 and a plurality of reference voltages Vref1, Vref2, and Vref3. The signal generator 180 includes three comparators 219, 220, and 221. The comparator 219 has its non-inverting terminal (+) connected to the first reference voltage Vref1, its inverting terminal (−) connected to the gate voltage Vg, and its output terminal outputting the select signal S1. The comparator 220 has its non-inverting terminal (+) connected to the second reference voltage Vref2, its inverting terminal (−) connected to the gate voltage Vg, and its output terminal outputting the select signal S2. And, the comparator 221 has its non-inverting terminal (+) connected to the third reference voltage Vref3, its inverting terminal (−) connected to the gate voltage Vg, and its output terminal outputting the select signal S3.

A phase locked loop (PLL) circuit 222 receives a reference clock signal CLKref, and generates a plurality of clock signals (e.g., 0.5CLKref, CLKref, 2CLKref, and 4CLKref) having different periods. The reference clock signal CLKref is a clock signal that can be generated in the device 100' or supplied from an external source, for example. A selector circuit 223 selects one of the clock signals 0.5CLKref, CLKref, 2CLKref, and 4CLKref in response to the select signals S1, S2, and S3, and the selected clock signal is applied to the functional blocks IP0–IPn as an internal clock signal CLK.

A mode of operation of an integrated circuit device having a framework as depicted in FIG. 3, will now be described in further detail. The internal voltage converter circuit 120 and the consumed current detecting circuit 140 depicted in FIG. 3 operate similar to those described above in FIG. 2, and descriptions thereof will thus be omitted. The gate voltage Vg is adjusted according to the amount of current that is consumed in the integrated circuit device 100'. As the gate voltage Vg varies, the period of a clock signal CLK is also adjusted.

For example, when the gate voltage Vg is lower than the reference voltage Vref1, the selector circuit 223 selects one (e.g., 0.5CLKref) of the clock signals 0.5CLKref, CLKref, 2CLKref, and 4CLKref in response to select signals S1, S2, and S3. When the gate voltage Vg is between the reference voltages Vref1 and Vref2, the selector circuit 223 selects one (e.g., CLKref) of the clock signals 0.5CLKref, CLKref, 2CLKref, and 4CLKref in response to select signals S1, S2, and S3. When the gate voltage Vg is between the reference voltages Vref2 and Vref3, the selector circuit 223 selects one (e.g., 2CLKref) of the clock signals 0.5CLKref, CLKref, 2CLKref, and 4CLKref in response to select signals S1, S2, and S3. When the gate voltage Vg is higher than the reference voltage Vref3, the selector circuit 223 selects one (e.g., 4CLKref) of the clock signals 0.5CLKref, CLKref, 2CLKref, and 4CLKref in response to select signals S1, S2, and S3. The selected clock signal is supplied to the functional blocks IP0–IPn as an internal clock signal CLK.

Advantageously, the present invention provides methods and circuits for obtaining optimum operating performance by continuously adjusting the clock speed (or the clock period) based on the amount of current consumed in an integrated circuit device. It is to be understood that although illustrative embodiments have been described herein with reference to the accompanying drawings, it is to be understood that the present invention is not limited to those precise embodiments, and that various other changes and modifications may be affected therein by one skilled in the art without departing from the scope and spirit of the invention. It is to be understood that all such changes and modifications are intended to be included within the scope of the invention as defined by the appended claims.

What is claimed is:

1. An integrated circuit device, comprising:
   a plurality of functional blocks;
   a power supply line which supplies an internal power supply voltage to the functional blocks;
   a voltage converter circuit which controls an amount of current supplied to the power supply line by comparing a reference voltage with the internal power supply voltage; and
   a clock generator circuit which generates a clock signal that is applied to the functional blocks;
   wherein the clock generator circuit adjusts a period of the clock signal according to the amount of current supplied to the power supply line.

2. The integrated circuit device according to claim 1, wherein the period of the clock signal increases when the amount of current supplied to the power supply line increases.

3. The integrated circuit device according to claim 1, wherein the period of the clock signal decreases when the amount of current supplied to the power supply line decreases.

4. An integrated circuit device, comprising:
   a plurality of functional blocks operating in response to a clock signal;
   a power supply line that supplies an internal power supply voltage to the functional blocks;
   a voltage converter circuit that compares the internal power supply voltage with a reference voltage and generates a first control voltage to control the amount of current supplied to the power supply line from an external power supply voltage;
   a control circuit that generates a second control voltage that varies according to the amount of current supplied to the power supply line by the voltage converter circuit; and
   a clock generator circuit which adjusts a period of the clock signal in response to the second control voltage.

5. The integrated circuit device according to claim 4, wherein the second control voltage increases in response to an increase the amount of current supplied to the power supply line, and wherein the period of the clock signal increases in response to an increase of the second control signal.

6. The integrated circuit device according to claim 4, wherein the second voltage decreases in response to a decrease of the amount of current supplied to the power supply line, and wherein the period of the clock decreases in response to a decrease of the second control voltage.

7. The integrated circuit device according to claim 4, wherein the voltage converter circuit comprises:
   a capacitor that is connected to the power supply line and a ground voltage;
   a comparator that compares a voltage across the capacitor with the reference voltage and outputs the first control voltage; and
   a driver that supplies current from the external power supply voltage to the power supply line in response to the first control voltage output from the comparator.

8. The integrated circuit device according to claim 4, wherein the control circuit comprises:
   a PMOS transistor, which is connected between the external power supply voltage and an output node, for outputting the second control voltage in response to the first control voltage; and
   an NMOS transistor, which is connected between the output node and the ground voltage, and operates in response to the second control voltage.

9. The integrated circuit device according to claim 4, wherein the clock generator circuit comprises:
   a plurality of serially connected inverters;
   a plurality of capacitors, wherein each capacitor is connected between ground and an output terminal of an associated one of the inverters; and
   a plurality of NMOS transistors, wherein each NMOS transistor is connected between one of the capacitors and the output terminal of the associated inverter, wherein the NMOS transistors are controlled in common by the second control voltage.

10. The integrated circuit device according to claim 4, wherein the clock generator circuit comprises:
    a clock generator that generates a plurality of clock signals in response to a reference clock signal, the clock signals having different periods from each other;
    a signal generator which generates select signals in response to the second control; and
    a selector which selects one of the clock signals in response to the select signals, wherein the selected clock signal is applied to the functional blocks as a clock signal.

11. The integrated circuit device according to claim 10, wherein the reference clock signal is supplied from an external source.

12. The integrated circuit device according to claim 10, wherein the reference clock signal is generated in the integrated circuit device.

13. An integrated circuit device, comprising:
    a plurality of functional blocks each operating in synchronization with a clock signal;
    a power supply line that supplies an internal power supply voltage to the functional blocks;
    charge storage means connected to the power supply line;
    a comparator circuit that compares a voltage on the power supply line with a reference voltage and generates a control voltage according to a comparison result;
    charge supplying means for supplying charges from an external power supply voltage to the power supply line in response to the control voltage; and
    a clock generator circuit which is supplied with the internal power supply voltage and generates the clock signal in response to the control voltage, wherein a period of the clock signal varies according to variation of the control voltage.

14. The integrated circuit device according to claim 13, wherein the charge supplying means comprises a PMOS transistor connected between the external power supply voltage and the power supply line, the PMOS transistor being controlled by the control voltage, and wherein the charge storing means comprises a capacitor connected between the power supply line and ground.

15. The integrated circuit device according to claim 13, wherein when the control voltage increases, the period of the clock signal increases.

16. The integrated circuit device according to claim 13, wherein when the control voltage decreases, the period of the clock signal decreases.

17. The integrated circuit device according to claim 13, wherein the clock generator circuit comprises:

first means which generates a second control voltage that varies according to variation of the control voltage; and second means which generates the clock signal whose period varies according to variation of the second control voltage.

18. The integrated circuit device according to claim 17, wherein the first means comprises:

a PMOS transistor which is connected between the external power supply voltage and an output node for outputting the second control voltage; and an NMOS transistor which is connected between the output node and a ground voltage and operates responsive to the second control voltage.

19. The integrated circuit device according to claim 17, wherein the second means comprises a ring oscillator comprising a plurality of serially connected inverters, wherein the ring oscillator outputs a clock signal having a period that varies with variation of the second control voltage.

20. The integrated circuit device according to claim 17, wherein the second means comprises:

a clock generator that generates a plurality of clock signals in response to a reference clock signal, the clock signals having different periods from each other;

a signal generator that generates select signals in response to the second control voltage; and a selector which selects one of the clock signals in response to the select signals, the selected clock signal being applied to the functional blocks as a clock signal.

21. A method for optimizing operating performance of an integrated circuit device comprising a plurality of functional blocks, the method comprising the steps of:

detecting an amount of current consumed by the integrated circuit device;

controlling an amount of current supplied to the functional blocks based on the detected current consumption; and adjusting a period of a clock signal applied to the functional blocks based on the detected current consumption.

22. The method according to claim 21, wherein the step of detecting the amount of current consumed comprises:

comparing a reference voltage with an internal power supply voltage that is applied to the functional blocks; and generating a control voltage in response to said comparing.

23. The method according to claim 22, wherein the step of controlling an amount of current supplied to the functional blocks based on the detected current consumption comprises applying the control voltage to a gate terminal of a transistor to adjust an amount of current flowing from an external power supply to an internal power supply line that feeds the internal power supply voltage to the functional blocks.

24. The method according to claim 22, wherein the step of adjusting a period of a clock signal applied to the functional blocks based on the detected current consumption comprises:

increasing the period of the clock signal when the detected current consumption increases; and decreasing the period of the clock signal when the detected current consumption decreases.

* * * * *